(12) United States Patent
Lin et al.

(10) Patent No.: US 11,127,437 B2
(45) Date of Patent: Sep. 21, 2021

(54) MANAGING STARTUPS OF BANDGAP REFERENCE CIRCUITS IN MEMORY SYSTEMS

(71) Applicant: Macronix International Co., Ltd., Hsinchu (TW)

(72) Inventors: Jian-Syu Lin, Chiayi (TW); Shang-Chi Yang, Changhua (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 16/842,318

(22) Filed: Apr. 7, 2020

(65) Prior Publication Data

US 2021/0098031 A1   Apr. 1, 2021

Related U.S. Application Data (60) Provisional application No. 62/908,602, filed on Oct. 1, 2019.

(51) Int. Cl.
*G11C 5/14* (2006.01)
*G05F 3/20* (2006.01)
(Continued)

(52) U.S. Cl.
CPC ............... *G11C 5/147* (2013.01); *G05F 3/20* (2013.01); *G05F 3/30* (2013.01); *G11C 5/148* (2013.01);
(Continued)

(58) Field of Classification Search
CPC ........... G11C 5/147; G11C 16/30; G11C 7/20; G11C 5/148; G05F 3/20; G05F 3/22;
(Continued)

(56) References Cited

U.S. PATENT DOCUMENTS 6,414,537 B1   7/2002   Smith
7,342,844 B2   3/2008   Shen et al.
(Continued)

FOREIGN PATENT DOCUMENTS

CN   103425171   12/2013
TW   200814079   3/2008
(Continued)

OTHER PUBLICATIONS

K. Lasanen et al., "Design of a 1 V low power CMOS bandgap reference based on resistive subdivision," The 2002 45th Midwest Symposium on Circuits and Systems, 2002.
(Continued)

*Primary Examiner* — Jung Kim
(74) *Attorney, Agent, or Firm* — Fish & Richardson P.C.

(57) ABSTRACT

Systems, methods, circuits, devices, and apparatus including computer-readable mediums for managing startups of bandgap reference circuits in memory systems, e.g., non-volatile memory systems. In one aspect, an integrated circuit includes: a power supply switch configured to receive an original supply voltage and provide a controlled supply voltage controllable by an enabling signal, an operational amplifier configured to receive input voltages and the controlled supply voltage and output a gate control voltage, output circuitry configured to receive the gate control voltage and the controlled supply voltage, provide the input voltages to the operational amplifier, and output a reference voltage, and initialization circuitry coupled to the power supply switch, the operational amplifier, and the output circuitry and configured to initialize the controlled supply voltage and the gate control voltage to ground based on the enabling signal, such that the reference voltage increases from ground to a target voltage during a startup.

20 Claims, 6 Drawing Sheets

(51) Int. Cl.
*H03F 3/45* (2006.01)
*H03K 17/22* (2006.01)
*H03F 1/30* (2006.01)
*G05F 3/30* (2006.01)
*G11C 16/30* (2006.01)

(52) U.S. Cl.
CPC ......... *H03F 1/301* (2013.01); *H03F 3/45269* (2013.01); *H03K 17/223* (2013.01); *G11C 16/30* (2013.01); *H03K 2017/226* (2013.01)

(58) Field of Classification Search
CPC . G05F 3/222; G05F 3/225; G05F 3/30; H03F 3/45269; H03F 2200/447; H03F 1/301; H03F 3/45183; H03F 1/302; H03K 17/223; H03K 2017/226
See application file for complete search history.

(56) References Cited

U.S. PATENT DOCUMENTS

| | | | |
|---|---|---|---|
| 7,433,247 | B2 | 10/2008 | Zheng et al. |
| 7,714,674 | B2 | 5/2010 | Guo et al. |
| 7,738,296 | B2 | 6/2010 | Lin |
| 9,887,011 | B1 | 2/2018 | Hung |
| 2001/0010480 | A1* | 8/2001 | Kato ................... G05F 1/465 327/546 |
| 2007/0081377 | A1 | 4/2007 | Zheng et al. |
| 2008/0061760 | A1 | 3/2008 | Jeong |
| 2008/0094130 | A1 | 4/2008 | Uang et al. |
| 2008/0157746 | A1 | 7/2008 | Chen |
| 2013/0049721 | A1 | 2/2013 | Lo et al. |
| 2019/0033902 | A1 | 1/2019 | Enjalbert et al. |
| 2019/0278312 | A1 | 9/2019 | Lin |

FOREIGN PATENT DOCUMENTS

| | | |
|---|---|---|
| TW | 200827978 | 7/2008 |
| TW | M422090 U1 | 2/2012 |
| WO | WO 2013/067192 | 5/2013 |
| WO | WO 2017/105796 | 6/2017 |

OTHER PUBLICATIONS

H. Banba et al., "A CMOS Bandgap Reference Circuit with Sub-1-V Operation", IEEE Journal of Solid-State Circuits, vol. 34(5):670-674, 1999.

B. Razavi, "Design of Analog CMOS Integrated Circuits", Second edition, 2017.

Taiwan Office Action issued in corresponding Application No. TW 11020265890 (English Translation not available) dated Mar. 23, 2021, 5 pages.

\* cited by examiner

MANAGING STARTUPS OF BANDGAP REFERENCE CIRCUITS IN MEMORY SYSTEMS

CROSS-REFERENCE TO RELATED APPLICATION

This application claims priority under 35 USC § 119(e) to U.S. Provisional Patent Application Ser. No. 62/908,602, filed on Oct. 1, 2019, the entire content of which is hereby incorporated by reference.

BACKGROUND

Integrated circuit memory systems are becoming smaller and faster. Reference voltage circuits are often used in these memory systems to provide reference voltages. For example, a bandgap reference circuit can provide a bandgap reference voltage to a non-volatile memory system for performing an operation of programming, erasing, verifying, or reading in a non-volatile memory. Therefore, it would be desirable to develop the bandgap reference circuit that can enable fast startups to obtain the bandgap reference voltage to thereby improve the performance of the non-volatile memory system.

SUMMARY

The present disclosure describes systems and techniques for managing startups of bandgap reference circuits in memory systems, e.g., non-volatile memory systems.

One aspect of the present disclosure features an integrated circuit including: a power supply switch configured to receive an original supply voltage and provide a controlled supply voltage controllable by an enabling signal; an operational amplifier configured to receive input voltages and the controlled supply voltage and output a gate control voltage; output circuitry configured to receive the gate control voltage from the operational amplifier and the controlled supply voltage from the power supply switch, provide the input voltages to the operational amplifier, and output a reference voltage; and initialization circuitry coupled to the power supply switch, the operational amplifier, and the output circuitry and configured to initialize the controlled supply voltage and the gate control voltage to a ground based on the enabling signal.

The output circuitry can be configured to stabilize the reference voltage to be independent from temperature, process corner, voltage, or a combination thereof.

In some implementations, the power supply switch includes a transistor having a gate for receiving the enabling signal and configured to generate the controlled supply voltage based on the original supply voltage in response to the enabling signal. The power supply switch can include an inverter coupled to the gate of the transistor and configured to convert a control signal into the enabling signal. During a startup in a power-on stage, the control signal can be based on a power-on-reset (POR) signal associated with the original supply voltage. During a startup in a normal operational stage, the original supply voltage can remain at a target supply voltage, and the control signal can include a step signal.

The initialization circuitry can be configured such that the reference voltage increases from the ground to a target voltage during a startup of the integrated circuit. The initialization circuitry can be configured to initialize the input voltages to be grounded based on the enabling signal, together with the controlled supply voltage and the gate control voltage.

In some implementations, the initialization circuitry includes a plurality of transistors having gates for receiving the enabling signal, sources coupled to a ground, and drains respectively coupled to the operational amplifier, the power supply switch, and the output circuitry.

In some examples, the operational amplifier includes p-channel transistors and re-channel transistors. Sources of the p-channel transistors are coupled to the power supply switch and configured to receive the controlled supply voltage, gates of the p-channel transistors are coupled to a drain of a first transistor of the initialization circuitry, and drains of the p-channel transistors are coupled to drains of the n-channel transistors, and gates of the n-channel transistors are configured to receive the input voltages from the output circuitry and respectively coupled to drains of second and third transistors of the initialization circuitry.

In some implementations, the output circuitry includes: a plurality of p-channel transistors having gates coupled to the drain of one of the p-channel transistors of the operational amplifier and receive the gate control voltage, where the gates of the p-channel transistors of the output circuitry are coupled to a drain of a fourth transistor of the initialization circuitry; and a plurality of bipolar junction transistors (BJTs) having emitters respectively coupled to drains of the p-channel transistors of the output circuitry, and bases and collectors of the plurality of BJTs are coupled to the ground, where the reference voltage is output at a connection node between a drain of one of the p-channel transistors of the output circuitry and an emitter of one of a corresponding BJT of the BJTs of the output circuitry. The integrated circuit can further include a coupling capacitor having a first end coupled to the power supply switch for receiving the controlled supply voltage and a second end coupled to the drain of the fourth transistor of the initialization circuitry and the gates of the p-channel transistors of the output circuitry.

In some implementations, the integrated circuit further includes a coupling capacitor having a first end coupled to the power supply switch for receiving the controlled supply voltage and a second end coupled to an output of the operational amplifier for outputting the gate control voltage. The coupling capacitor can be configured such that the gate control voltage varies substantially proportionally and synchronously with the controlled supply voltage during the startup.

Another aspect of the present disclosure features a memory system including: a memory, a memory controller coupled to the memory, and a bandgap reference circuit coupled to the memory controller and configured to provide a bandgap reference voltage to the memory controller for performing one or more actions on the memory. The bandgap reference circuit includes: a power supply switch configured to receive an original supply voltage and provide a controlled supply voltage controllable by an enabling signal; an operational amplifier configured to receive input voltages and the controlled supply voltage and output a gate control voltage; output circuitry configured to receive the gate control voltage from the operational amplifier and the controlled supply voltage from the power supply switch, provide the input voltages to the operational amplifier, and output an output voltage as the bandgap reference voltage; and initialization circuitry coupled to the power supply switch, the operational amplifier, and the output circuitry and configured to initialize the controlled supply voltage and the gate control voltage to a ground based on the enabling signal.

In some implementations, the memory system further includes a coupling capacitor having a first end coupled to the power supply switch for receiving the controlled supply voltage and a second end coupled to an output of the operational amplifier for outputting the gate control voltage. The coupling capacitor can be configured such that the gate control voltage varies substantially proportional and synchronously with the controlled supply voltage during a startup of the bandgap reference circuit.

In some implementations, the initialization circuitry includes a plurality of transistors having gates for receiving the enabling signal, sources coupled to a ground, and drains respectively coupled to the operational amplifier, the power supply switch, and the output circuitry.

In some implementations, the operational amplifier includes p-channel transistors and n-channel transistors, where sources of the p-channel transistors are coupled to the power supply switch and configured to receive the controlled supply voltage, gates of the p-channel transistors are coupled to a drain of a first transistor of the initialization circuitry, and drains of the p-channel transistors are coupled to drains of the n-channel transistors, and where gates of the n-channel transistors are configured to receive the input voltages from the output circuitry and respectively coupled to drains of second and third transistors of the initialization circuitry.

In some implementations, the output circuitry includes: a plurality of p-channel transistors having gates coupled to the drain of one of the p-channel transistors of the operational amplifier and receive the gate control voltage, where the gates of the p-channel transistors of the output circuitry are coupled to a drain of a fourth transistor of the initialization circuitry. The output circuitry can include a plurality of bipolar junction transistors (BJTs) having emitters respectively coupled to drains of the p-channel transistors of the output circuitry, and bases and collectors of the plurality of BJTs are coupled to the ground, where the bandgap reference voltage is output at a connection node between a drain of one of the p-channel transistors of the output circuitry and an emitter of one of a corresponding BJT of the BJTs of the output circuitry.

In some implementations, the power supply switch includes: a transistor having a gate for receiving the enabling signal, and an inverter coupled to the gate of the transistor and configured to receive a control signal and convert the control signal into the enabling signal. The bandgap reference circuit can be configured such that the bandgap reference voltage increases from the ground to a bandgap target voltage during a startup of the bandgap reference circuit. The memory controller can be configured to: when the startup is in a power-on stage, generate a power-on-reset (POR) signal based on the original supply voltage, generate the control signal based on the POR signal, and provide the control signal to the inverter, and when the startup is in a normal operation range, generate a wakeup signal as the control signal and provide the output signal to the inverter.

A further aspect of the present disclosure features an integrated circuit including: a power supply switch configured to receive an enabling signal and an original supply voltage and to controllably output a controlled supply voltage at a power terminal with the controlled supply voltage at a first voltage when the enabling signal is in a first state and to have the power terminal grounded when the enabling signal is in a second state; an operational amplifier including a pair of input terminals, a voltage supply terminal coupled to the power terminal to receive the controlled supply voltage, and an output terminal to output a gate control voltage; output circuitry coupled to the output terminal of the operational amplifier to receive the gate control voltage and coupled to the power terminal to receive the controlled supply voltage, the output circuitry configured to generate and feedback a pair of input voltages to the pair of input terminals of the operational amplifier, and to output a reference voltage; and initialization circuitry coupled to the power supply switch, the operational amplifier, and the output circuitry, and configured to receive the enabling signal and to drive the controlled supply voltage and the gate control voltage to ground when the enabling signal is in the second state.

Another further aspect of the present disclosure features a method of managing startups of a reference voltage circuit, including: initializing the reference voltage circuit by an enabling signal being at a first level before a first time point. The reference voltage circuit includes: a power supply switch configured to receive an original supply voltage and output a controlled supply voltage based on the enabling signal, an operational amplifier configured to receive input voltages and the controlled supply voltage and output a gate control voltage, and output circuitry configured to receive the gate control voltage and the controlled supply voltage, provide the input voltages to the operational amplifier, and output a reference voltage. The reference voltage circuit is initialized such that the controlled supply voltage, the gate control voltage, and the reference voltage are grounded before the first time point.

The method further includes: capacitively coupling the controlled supply voltage to the gate control voltage when the enabling signal becomes to be at a second level after the first time point, such that the gate control voltage increases from a grounded voltage to be substantially proportional to the controlled supply voltage and outputting the reference voltage based on the gate control voltage, the reference voltage increasing from the grounded voltage at the first time point and reaching a target voltage at a second time point later than the first time point.

The method can further include generating the enabling signal based on a control signal. The method can further include: generating a power-on-reset (POR) signal based on the original supply voltage, and generating a control signal based on the POR signal. The control signal can be a wake up signal including a step signal.

The method can further include: stabilizing, by the output circuitry, the reference voltage to be independent from temperature, process corner, voltage, or a combination thereof.

Implementations of the above techniques include methods, systems, circuits, computer program products and computer-readable media. In one example, a method can be performed in a non-volatile memory and the method can include the above-described actions, e.g., the actions for managing startups of reference voltage circuits. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented for any type of circuits or devices that need fast startup (or setup). The techniques can speed up the startup to a steady state and avoid overshoot phenomenon during the startup. The techniques also enable other circuits or devices, e.g., charge pumps or comparator circuits, using reference voltages provided by reference voltage circuits with fast startups to start earlier, without component breakdown due to reference voltage overshoot. For example, in a non-volatile memory system, a bandgap reference circuit can provide a bandgap reference voltage to a memory controller for performing an operation of programming, erasing, verifying, or reading in a non-volatile memory. In some cases, for a startup during a power-on stage, the bandgap reference voltage changes from a higher supply voltage to a lower bandgap target voltage, which may cause a long startup time. Additionally, for a startup during a normal operation stage, the bandgap reference circuit needs to be activated by a startup pulse, which may cause overshoots on other components in the memory devices and need a long time to recover to the bandgap target voltage as well.

Implementations of the techniques can achieve a bandgap reference circuit with fast startups, for example, by adding a power metal-oxide-silicon (MOS) transistor, a coupling capacitor, and an initialization circuitry to change startups during power on reset (POR) and normal operation. The coupling capacitor can make a gate control voltage vary proportionally and synchronously with a controlled supply voltage. The power MOS transistor can initially pull the gate control voltage down to 0 V, such that the bandgap reference voltage associated with the gate voltage is charged up from 0 V, instead of discharging from a supply voltage VDD, to a bandgap target voltage, which can greatly speed up the startup time (e.g., over one order of magnitude) and avoid overshoots to other components in the circuits or devices. Moreover, in normal operation, the power MOS allows the gate control voltage to be discharged to the ground by the initialization circuitry before a startup, thus the bandgap reference circuit does not need a startup pulse. Thus, the bandgap reference circuit can achieve fast startup without short pulse and overshoots, thereby improving the performance of the memory. Meanwhile, the bandgap reference circuit can provide a stable bandgap reference voltage that can be independent from temperatures, process corners, and/or voltages, or PVT (process-voltage-temperature) effect, that is, the bandgap reference voltage can be kept substantially constant under different process corners, different temperatures, and/or different voltages.

The techniques can be implemented with any types of memory transistors, any types of metal-oxide-silicon (MOS) transistors, e.g., n-channel transistors (NMOS) and/or p-channel transistors (PMOS), any types of bipolar junction transistors (BJTs), and any types of operational amplifiers (OPAs) such as folded-cascade OPAs or two-stage OPAs. The techniques can be implemented with any types of capacitors, such as metal-insulator-metal capacitors (MIMCAPs), metal-oxide-silicon capacitors (MOSCAPs), or metal-oxide-semiconductor field-effect transistor capacitors (MOSFET CAPs).

The techniques can be applied to various memory types, such as SLC (single-level cell) devices, or MLC (multi-level cell) devices like 2-level cell devices or TLC (triple-level cell) devices. The techniques can be applied to various types of non-volatile memory devices, such as NOR flash memory, NAND flash memory, resistive random-access memory (RRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

Figure 1:
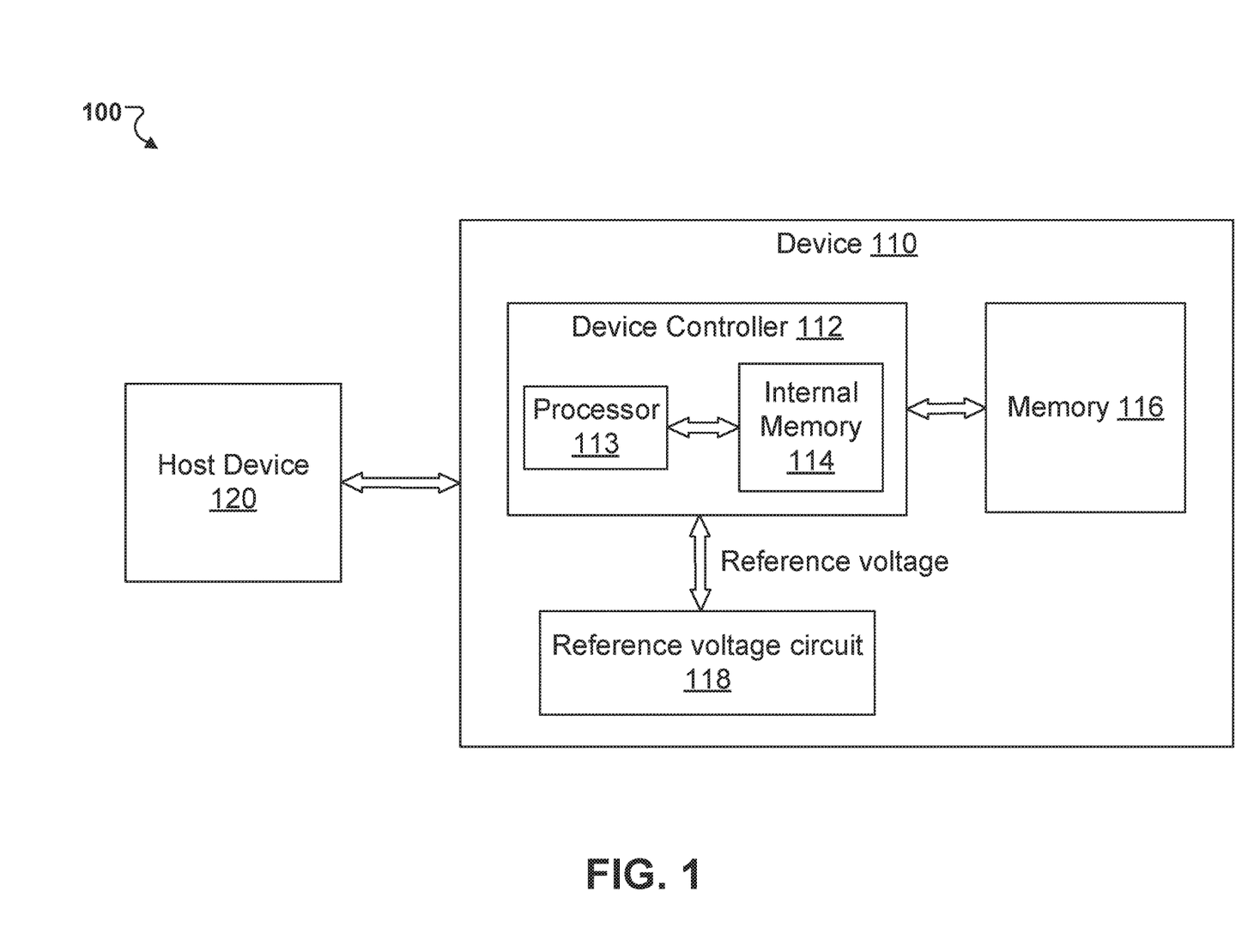
FIG. 1 illustrates an example of a system including a memory system, according to one or more implementations.

FIG. 1 illustrates an example of a system 100. The system 100 includes a device 110 and a host device 120. The device 110 can be a memory system including a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., an NAND or NOR flash memory device, or some other suitable non-volatile memory device. In implementations where the memory 116 is an NAND or NOR flash memory, the device 110 is a flash memory device, e.g., a flash memory card, and the device controller 112 is an NAND or NOR flash controller. For example, in some implementations, when the device 110 is an eMMC or an SD card, the memory 116 is an NAND or NOR flash; in some implementations, when the device 110 is a digital camera, the memory 116 is an SD card; and in some implementations, when the device 110 is a media player, the memory 116 is a hard disk.

The device 110 includes a reference voltage circuit 118. The reference voltage circuit 118 is configured to generate a reference voltage provided to the device controller 112. The device controller 112 can receive the reference voltage and perform one or more actions in the memory 116. The reference voltage can be independent from temperature, process corner, voltage, or an overall PVT effect.

The reference voltage circuit 118 can be a bandgap reference circuit configured to generate a bandgap reference (BGREF) voltage. As illustrated in FIG. 1, the bandgap reference circuit can provide the bandgap reference voltage to the device controller 112. The device controller 112 can receive the bandgap reference voltage and use the BGREF voltage to produce a level of a control signal in a word line or a bit line for performing an operation of programming, erasing, verifying, or reading for the memory 116. For example, the device controller 112 can read data in the memory 116 by the bandgap reference voltage for obtaining a reading result. In some examples, the bandgap reference circuit can provide the bandgap reference voltage to a bit line clamping circuit that can be included in the device controller 112. The bit line clamping circuit is configured to generate a stable bit line clamping voltage based on the bandgap reference voltage. The bit line clamping voltage can be independent from PVT effect. The bit line clamping voltage can be provided to a bit line of a memory cell in the memory 116 for reading data from the memory cell.

In some examples, the bandgap reference voltage is used to generate one or more operational voltages for one or more other components, circuits, and/or devices in the device 110. For example, the operational voltages can be multiple times (e.g., 2 times, 5 times, 10 times, or more) higher than the bandgap reference voltage. If the bandgap reference voltage is too high, the operational voltages can exceed damage threshold voltages of the one or more other components, circuits, and/or devices, which can cause overshoots or damages. For example, the bandgap reference voltage reaches a bandgap target voltage of 1 V after a startup completes. A device has an operational voltage that is 10 times of the bandgap reference voltage and a damage threshold voltage of about 15 V. If the bandgap reference voltage varies from 3 V to 1 V during the startup, the operational voltage of the device accordingly varies from 30 V to 10 V during the startup. Thus, the operational voltage can exceed the damage threshold voltage of the device during the startup and cause overshoot or damage on the device. Therefore, it is desirable for the bandgap reference circuit configured to generate the bandgap reference voltage varying within a reasonable range that will not cause overshoots.

When the bandgap reference circuit is turned on, the bandgap reference circuit may receive a power-on reset (POR) signal and enter a power-on stage to perform a start up operation. It may take a setup time for the bandgap reference voltage to reach a bandgap target voltage. After the power-on stage completes, the bandgap reference circuit can enter into a normal operation stage. During the normal operation range, the bandgap reference circuit can be idle and turned off, for example, when the device controller 112 does not need the bandgap target voltage for performing an action on the memory 116, and the bandgap reference voltage can be grounded or 0 V. When the bandgap target voltage is needed, the bandgap reference circuit can be woken up or started up again. For the startup during the normal operation range, it also takes a setup time for the bandgap reference voltage to reach the bandgap target voltage. Thus, it is desirable for the bandgap reference circuit to have fast startup (i.e., a short setup time) during both the power-on stage and the normal operation stage, which can accordingly improve the performance of the device 110 and/or the system 100.

Figure 2:
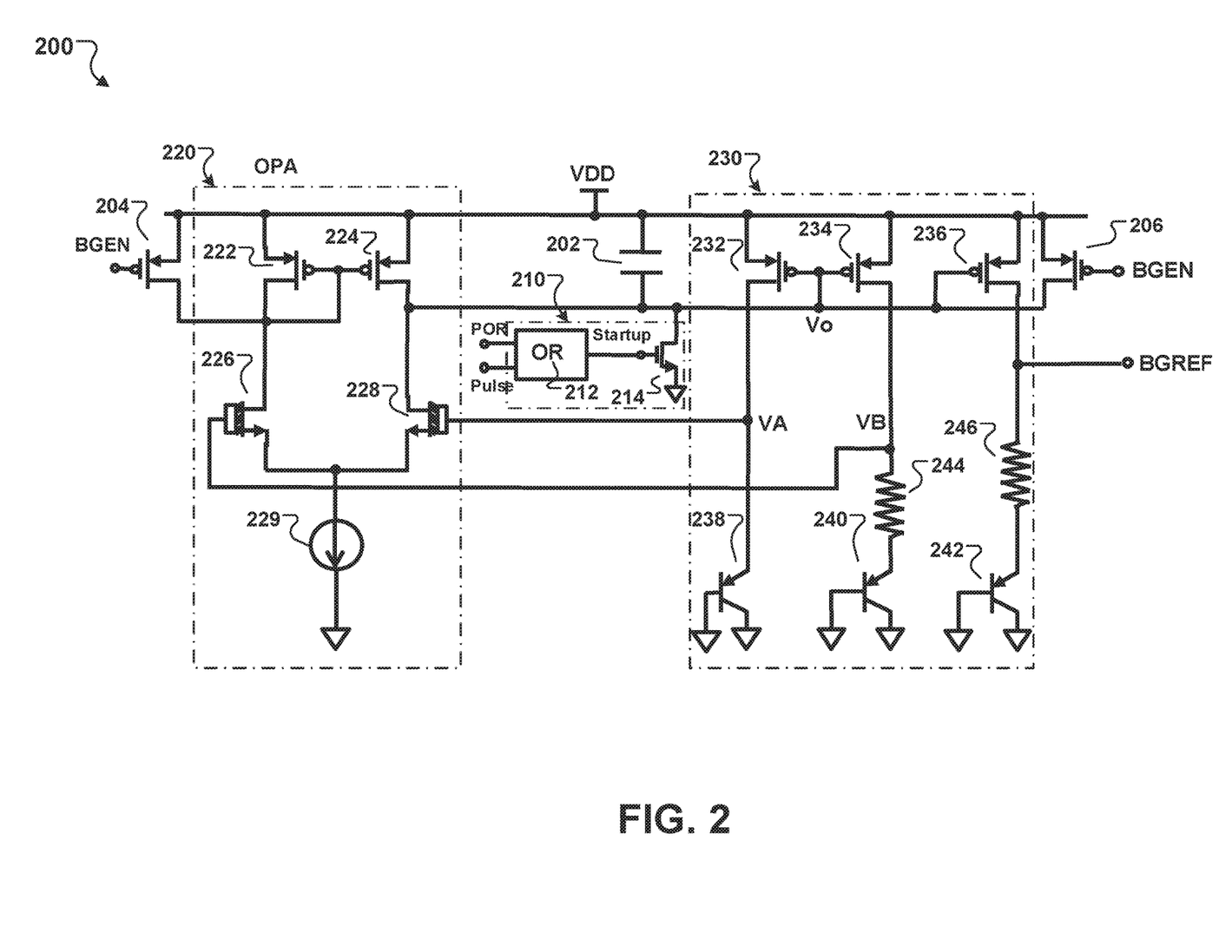
FIG. 2 shows an example circuit diagram illustrating a bandgap reference circuit.
Figure 3A:
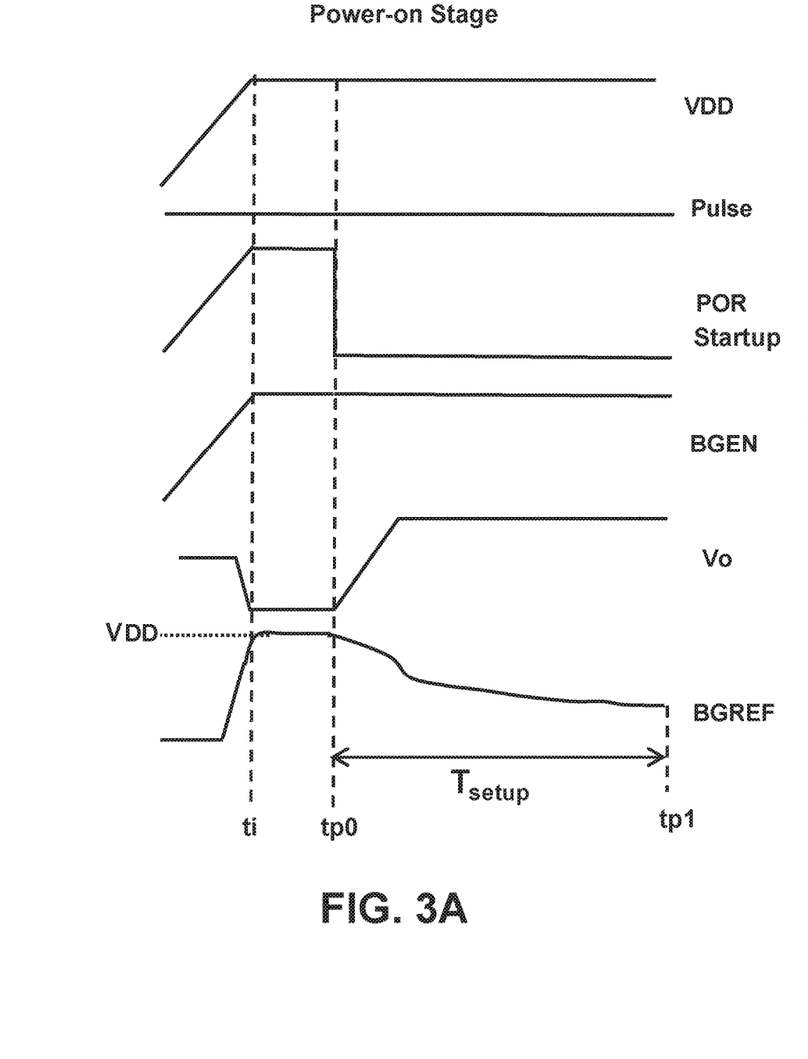
FIG. 3A shows a schematic diagram showing variations of different voltages or signals in the bandgap reference circuit of FIG. 2 with time at a startup during a power-on stage.
Figure 3B:
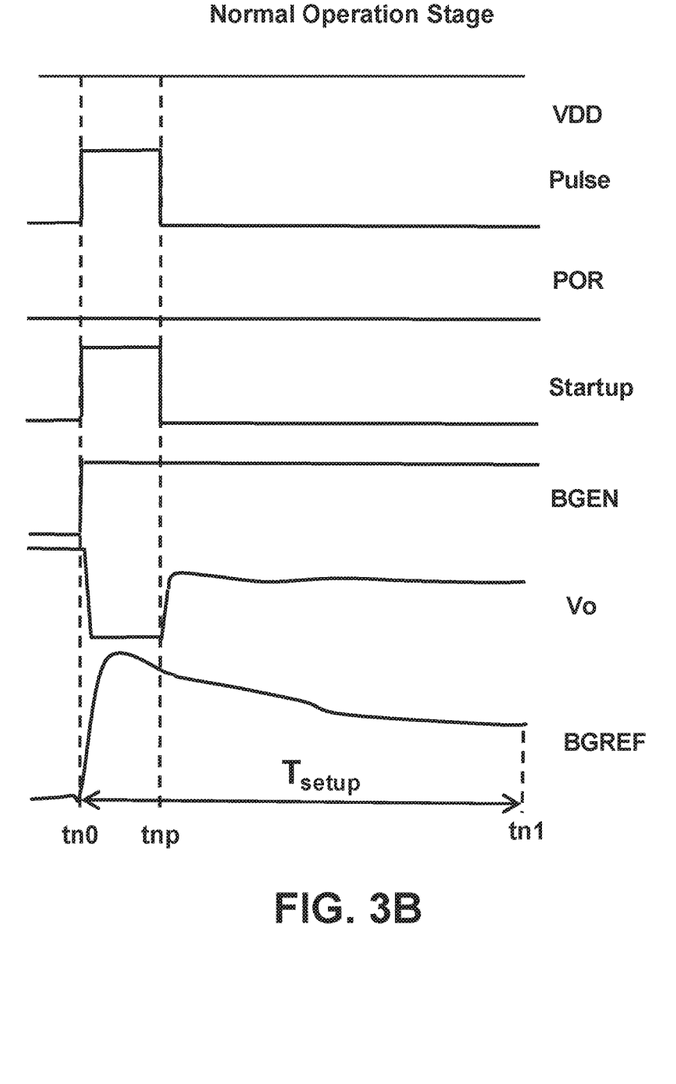
FIG. 3B shows a schematic diagram showing variations of different voltages or signals in the bandgap reference circuit of FIG. 2 with time at a startup during a normal operation stage.

FIG. 2 shows an example circuit diagram illustrating a bandgap reference circuit 200 configured to provide a bandgap reference (BGREF) voltage. The bandgap reference circuit 200 can be used as the reference voltage circuit 118 of FIG. 1. The bandgap reference circuit 200 includes a capacitor 202, a startup signal circuit 210, initialization circuitry having a transistor 204 and a transistor 206, an operational amplifier (OPA) 220, and output circuitry 230. FIG. 3A shows a schematic diagram showing variations of different voltages or signals in the bandgap reference circuit 200 with time at a startup during a power-on stage. FIG. 3B shows a schematic diagram showing variations of the different voltages or signals in the bandgap reference circuit 200 with time at a startup during a normal operation stage.

The startup signal circuit 210 includes an OR gate 212 and a transistor 214, e.g., an NMOS transistor. The OR gate 212 is configured to receive a power-on rest (POR) signal and a pulse signal and output a startup signal. The transistor 214 includes a gate for receiving the startup signal, a source coupled to a ground, and a drain coupled to the OPA 220 and the output circuitry 230. During the power-on stage, as illustrated in FIG. 3A, the pulse signal keeps low and the POR signal is output by the OR gate 212 as the startup signal. During the normal operation stage, as illustrated in FIG. 3B, the POR signal keeps low and the pulse signal is output by the OR gate 212 as the startup signal.

The bandgap reference circuit 200 is configured to receive a supply voltage VDD. During the power-on stage, as illustrated in FIG. 3A, the supply voltage increases from 0 V to VDD and then stabilizes at VDD. During the normal operation stage, as illustrated in FIG. 3B, the supply voltage maintains at VDD. The capacitor 202 has one end coupled to the supply voltage and the other end coupled to the drain of the transistor 214.

Each of the transistors 204 and 206 in the initialization circuitry can be a p-channel transistor, e.g., PMOS, and can be configured to receive a bandgap enabling (BGEN) signal at a gate and the supply voltage VDD at a source. A drain of the transistor 204 is coupled to the OPA 220, and a drain of the transistor 206 is coupled to the output circuitry 330.

The OPA 220 includes two p-channel transistors 222 and 224, e.g., PMOS transistors, two n-channel transistors 226 and 228, e.g., NMOS transistors, and a current transistor 229. The p-channel transistors 222 and 224 have their gates coupled together to the drain of the transistor 204 and their sources coupled together to receive the supply voltage VDD. A drain of the p-channel transistor 222 is coupled to the drain of the transistor 204 and to a drain of the n-channel transistor 226. A drain of the p-channel transistor 224 is coupled to the drain of the transistor 214 and to a drain of the n-channel transistor 228. Sources of the two n-channel transistors 226 and 228 are coupled together to the current transistor 229 configured for biasing current and coupled to the ground. Gates of the two n-channel transistors 226 and 228 are two inputs of the OPA 220 and configured to receive respective input voltages VA and VB from the output circuitry 230.

The output circuitry 230 includes three p-channel transistors 232, 234, 236, e.g., PMOS transistors, and three bipolar junction transistors (BJTs) 238, 240, 242, e.g., PNP BJTs. Sources of the p-channel transistors 232, 234, 236 are connected together to receive the supply voltage VDD. Gates of the p-channel transistors 232, 234, 236 are connected together to the drain of the transistor 214, the other end of the capacitor 202, the drain of the transistor 224 in the OPA 220, and the drain of the transistor 206 in the initialization circuitry. Thus, a gate control voltage Vo at the gates of the p-channel transistors 232, 234, 236 are associated with the supply voltage VDD, the OPA 220, the BGEN signal, and the startup signal circuit 210. The gate control voltage Vo can be considered as an output of the OPA 220.

A drain of the p-channel transistor 232 is configured to provide an input voltage VA to the gate of the n-channel transistor 228 of the OPA 220, and a drain of the p-channel transistor 234 is configured to provide the input voltage VB to the gate of the n-channel transistor 226 of the OPA 220. An emitter of the BJT 238 is connected to the drain of the p-channel transistor 232, and a base and a collector of the BJT 238 are both coupled to the ground. An emitter of the BJT 240 is connected to the drain of the p-channel transistor 234 through a resistor 244, and a base and a collector of the BJT 240 are both coupled to the ground. An emitter of the BJT 242 is connected to the drain of the p-channel transistor 236 through a resistor 246, and a base and a collector of the BJT 242 are both coupled to the ground. The bandgap reference circuit 200 is configured to output the bandgap reference (BGREF) voltage at a connection point between the drain of the p-channel transistor 236 and the resistor 246.

Referring to FIG. 3A, for the startup at the power-on stage, the supply voltage increases from 0 V and reaches VDD at time point ti. The POR signal is generated based on the supply voltage and increases from 0 V to a higher voltage (e.g., VDD) at ti and decreases to a lower voltage (e.g., 0 V) at time point tp0. As the pulse keeps low (e.g., at 0 V), the startup signal is the same as the POR signal. The bandgap enabling (BGEN) signal varies same with the supply voltage. The gate control voltage Vo initially has a voltage higher than 0 V, e.g., VDD, then is pulled down to 0 V at ti and pulled up at tp0 to a higher voltage when VA is equal to VB. Note that the bandgap reference circuit 200 needs to pull Vo first to a lower voltage level to avoid the startup fail. For example, the p-channel transistors 232, 234, 236 can be turned off if Vo is not pulled low and keeps high. The bandgap reference (BGREF) voltage is increased from 0 V to VDD at ti, keeps high between ti and tp0, and is gradually decreased to a bandgap target voltage at tp1. A time period between the tp0 and tp1 is the setup time Tsetup of the bandgap reference circuit 200. In some examples, at the end of power-on stage, VDD is about 3 V, Vo is about 2 V, and the bandgap target voltage is about 1 V. The setup time Tsetup is in the microsecond (µs) range, e.g., 1 µs to 10 µs.

Referring to FIG. 3B, for the normal operation stage, the supply voltage remains at VDD. The POR signal is kept low (e.g., at 0 V), the pulse signal includes a pulse having a higher voltage (e.g., VDD) during a pulse width (from tn0 to tnp), and thus the startup signal is the same as the pulse signal. The bandgap enabling (BGEN) signal increases from 0 V to VDD at tn0 when the bandgap reference circuit 200 is turned on. The gate control voltage Vo is pulled down by the pulse signal from a higher voltage (e.g., VDD) to 0 V during the time period tn0 to tnp, and pulled up from tnp to a higher voltage. The bandgap reference voltage increases from 0 V to a higher voltage (e.g., VDD) and then gradually decreases to the bandgap target voltage at tn1. A time period between the tn0 and tn1 is the setup time Tsetup of the bandgap reference circuit 200. The setup time Tsetup depends on the pulse width of the pulse signal and an operation current. When the operation current is higher and the pulse width is shorter, the setup time can be shorter. However, a shorter pulse width of the pulse signal cannot pull the gate control voltage Vo to 0 V, and a higher operation current can cause a larger power consumption. The setup time Tsetup is normally in the microsecond (µs) range.

Although the bandgap reference circuit 200 can provide the bandgap target voltage, the setup time for startups during the power-on stage and the normal operation range is long (e.g., in the µs range), where the bandgap reference voltage needs to decrease from a higher voltage (e.g., VDD) to the lower bandgap target voltage. Moreover, the higher voltage value of the bandgap reference voltage can cause overshoots in other circuits or devices having operation voltages that are multiple times of the bandgap target voltage but having damage threshold voltages that are lower than multiple times of the supply voltage VDD. Furthermore, the requirement of a startup pulse during the normal operation range increases the complexity of the bandgap reference circuit.

Implementations of the present disclosure provide a bandgap reference circuit with fast startup, for example, by adding a power metal-oxide-silicon (MOS) transistor, a coupling capacitor, and an initialization circuitry to change startups during power on reset (POR) and normal operation. The coupling capacitor can make a gate control voltage vary proportionally and synchronously with a controlled supply voltage. The power MOS transistor can initially pull the gate control voltage low to 0 V such that the bandgap reference voltage associated with the gate control voltage is charged up from 0 V, instead of discharging from a supply voltage VDD, to a bandgap target voltage, which can greatly speed up the startup time (e.g., over one order of magnitude) and avoid overshoots to other components in the circuits or devices. Moreover, in normal operation, the power MOS allows the gate control voltage to be discharged to the ground by the initialization circuitry before a startup, thus the bandgap reference circuit does not need a startup pulse. Thus, the bandgap reference circuit can achieve fast startup without short pulse and overshoots.

Figure 4:
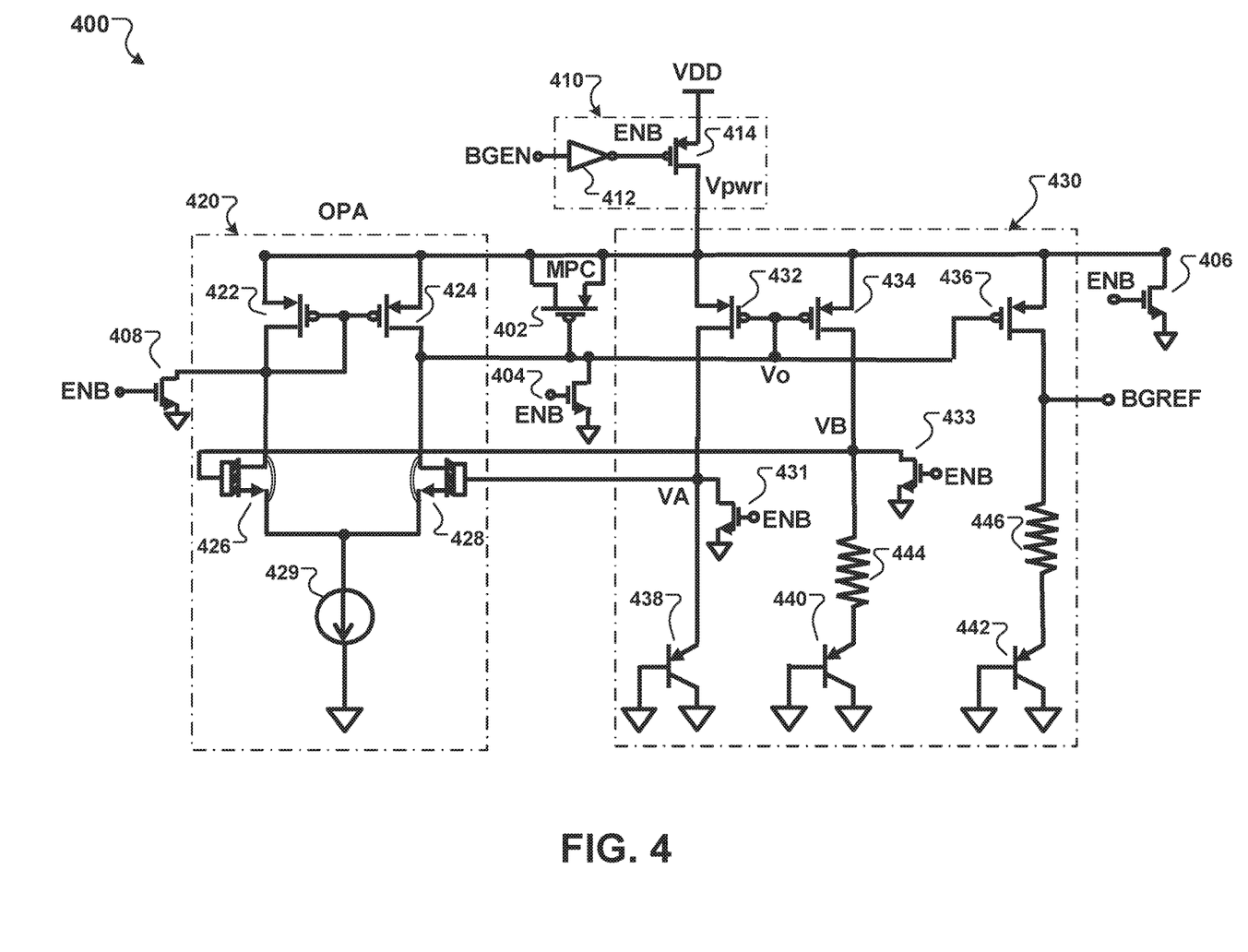
FIG. 4 shows an example circuit diagram of a bandgap reference circuit, according to one or more implementations.
Figure 5A:
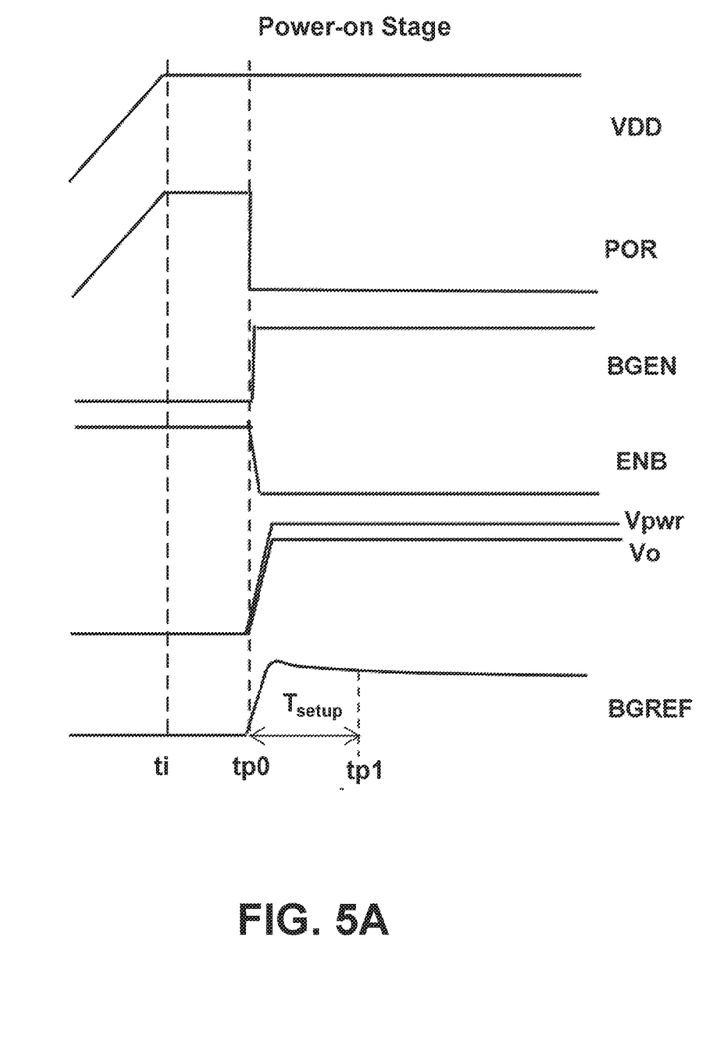
FIG. 5A shows a schematic diagram showing variations of different voltages or signals in the bandgap reference circuit of FIG. 4 with time at a startup during a power-on stage, according to one or more implementations.
Figure 5B:
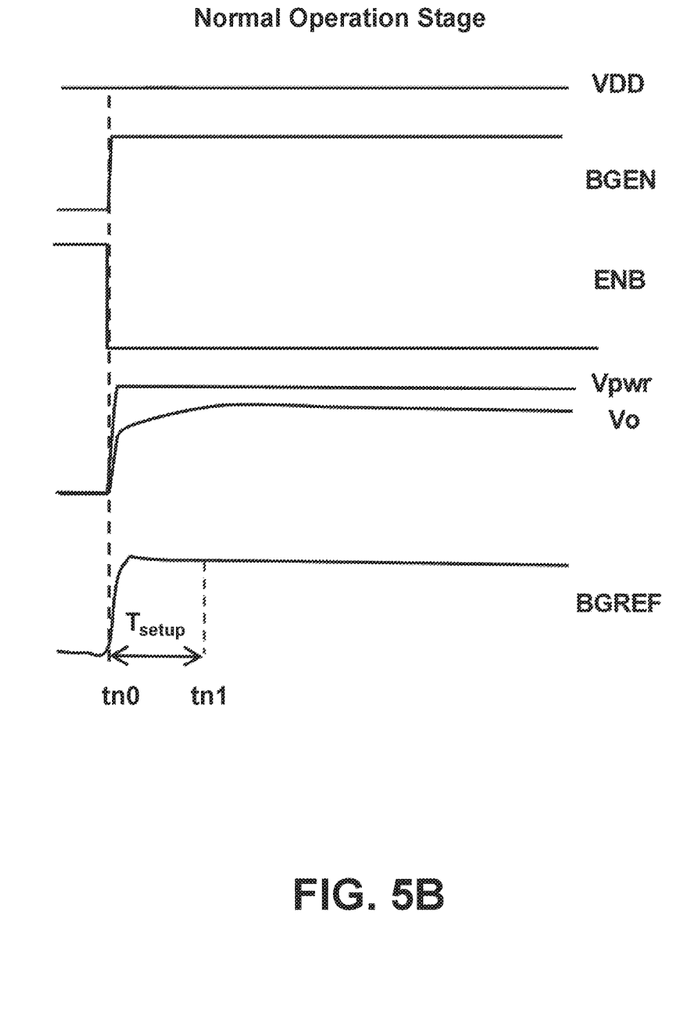
FIG. 5B shows a schematic diagram showing variations of different voltages or signals in the bandgap reference circuit of FIG. 4 with time at a startup during a normal operation stage, according to one or more implementations.

FIG. 4 shows an example circuit diagram of a bandgap reference circuit 400, according to one or more implementations. The bandgap reference circuit 400 can provide the reference voltage circuit 118 of FIG. 1. The bandgap reference circuit 400 can provide a stable bandgap reference voltage to a memory controller, e.g., the device controller 112 of FIG. 1, for performing operations on a memory, e.g., the memory 116 of FIG. 1. In contrast to the bandgap reference circuit 200 of FIG. 2, the bandgap reference circuit 400 can achieve faster startups during a power-on stage and a normal operation stage, without startup pulses and overshoots. FIG. 5A shows a schematic diagram showing variations of different voltages or signals in the bandgap reference circuit 400 of FIG. 4 with time at the startup during the power-on stage, according to one or more implementations. FIG. 5B shows a schematic diagram showing variations of the different voltages or signals in the bandgap reference circuit of FIG. 4 with time at the startup during the normal operation stage, according to one or more implementations.

Compared to the bandgap reference circuit 200 that is configured to directly receive a supply voltage VDD, the bandgap reference circuit 400 includes a power supply switch 410 configured to receive the supply voltage VDD and generate a controlled supply voltage Vpwr based on the supply voltage. In some implementations, the power supply switch 410 includes an inverter 412 and a power transistor 414, e.g., a PMOS transistor. The inverter 412 is configured to convert a bandgap enabling (BGEN) signal (e.g., a control signal) to an enabling (ENB) signal. The power transistor 414 is configured to receive the supply voltage VDD at a source and the ENB signal at a gate and output the controlled supply voltage Vpwr at a drain. When the ENB signal is at a high voltage level, the power transistor 414 is turned off and blocks the supply voltage VDD to the other components in the bandgap reference circuit 200; when the ENB signal is at a low voltage level, the power transistor 414 is turned on and provides the controlled supply voltage Vpwr.

The bandgap reference circuit 400 can include an operational amplifier (OPA) 420 and output circuitry 430 The output circuitry 430 is a bandgap core circuit that combines a positive temperature coefficient circuit and a negative temperature coefficient circuit. The OPA 420 can be any suitable type of OPA, such as a folded-cascade OPA or a two-stage OPA. The OPA 420 and the output circuitry 430 are coupled with each other, where the OPA 420 is configured to provide a gate control voltage Vo to the output circuitry 430, and the output circuitry 430 is configured to provide input voltages VA and VB into respective inputs of the OPA 420.

In some implementations, the OPA 420 includes two p-channel transistors 422 and 424, e.g., PMOS transistors, two n-channel transistors 426 and 428, e.g., NMOS transistors, and a current transistor 429. The p-channel transistors 422 and 424 have their gates coupled together to a drain of the p-channel transistor 422 and their sources coupled together to receive the controlled supply voltage Vpwr. The drain of the p-channel transistor 422 is coupled to a drain of the n-channel transistor 426. A drain of the p-channel transistor 424 is coupled to a drain of the n-channel transistor 428. Sources of the two n-channel transistors 426 and 428 are coupled together to the current transistor 429 configured for biasing current and coupled to the ground. Gates of the two n-channel transistors 426 and 428 are two inputs of the OPA 420 and configured to receive the respective input voltages VA and VB from the output circuitry 430.

In some implementations, the output circuitry 430 includes three p-channel transistors 432, 434, 436, e.g., PMOS transistors, and three bipolar junction transistors (BJTs) 438, 440, 442, e.g., PNP BJTs. Sources of the p-channel transistors 432, 434, 436 are connected together to receive the controlled supply voltage Vpwr. Gates of the p-channel transistors 432, 434, 436 are connected together to the drain of the p-channel transistor 424 in the OPA 420. Thus, the gate control voltage Vo can be considered as an output of the OPA 420. A drain of the p-channel transistor 432 is configured to provide an input voltage VA to the gate of the n-channel transistor 428 of the OPA 420, and a drain of the p-channel transistor 434 is configured to provide the input voltage VB to the gate of the n-channel transistor 426 of the OPA 420. An emitter of the BJT 438 is connected to the drain of the p-channel transistor 432, and a base and a collector of the BJT 438 are both coupled to the ground. An emitter of the BJT 440 is connected to the drain of the p-channel transistor 434 through a resistor 444, and a base and a collector of the BJT 440 are both coupled to the ground. An emitter of the BJT 442 is connected to the drain of the p-channel transistor 436 through a resistor 446, and a base and a collector of the BJT 442 are both coupled to the ground. The bandgap reference circuit 400 is configured to output the bandgap reference (BGREF) voltage at a connection point between the drain of the p-channel transistor 436 and the resistor 446.

The output circuitry 430 is configured to stabilize the bandgap reference voltage such that the bandgap reference voltage can be substantially independent from temperature, process corner, and/or voltage. In a particular example, the output circuitry 430 is configured such that the bandgap reference voltage is independent from PVT effect. In some implementations, the p-channel transistors 432, 434, the BJTs 438, 440, and the resistor 444 form a proportional to absolute temperature (PTAT) circuit configured together to be positively affected by temperature (e.g., to have a current associated with a positive temperature coefficient). The BJT 442 forms a complementary to absolute temperature (CTAT) circuit and is configured to be negatively affected by temperature (e.g., to have a current associated with a negative temperature coefficient). The BJT 442 is for CTAT voltage generation. The p-channel transistor 436, the BJT 442, and the resistor 446 are configured for zero to absolute temperature (ZTAT) voltage generation and configured together not to be affected by temperature. In such a way, the output circuitry 430 can be configured to stabilize the bandgap reference voltage independent from temperature (e.g., to have a current with zero temperature coefficient). The transistors in the output circuitry 430 can be fabricated during a same process such that the effect of process corner can be suppressed or eliminated.

The bandgap reference circuit 400 can further include a coupling capacitor 402 (or a compensation capacitor) having a first end coupled to the drain of the power transistor 414 for receiving the controlled supply voltage Vpwr and a second end coupled to the gates of the p-channel transistors 432, 434, 436 of the output circuitry 430 for providing the gate control voltage Vo. The coupling capacitor is configured to associate the gate control voltage Vo with the controlled supply voltage Vpwr. By configuring the coupling capacitor 402, the gate control voltage Vo can be substantially proportional to the controlled supply voltage Vpwr. Thus, when the controlled supply voltage Vpwr is 0 V, the gate control voltage is also 0 V. When the controlled supply voltage Vpwr ramps up, the gate control voltage Vo can be quickly coupled high by the coupling capacitor 402.

In some examples, the coupling capacitor 402 is a transistor, e.g., an MOS transistor, having its source and drain coupled together as the first end coupled to the power transistor 414 in the power supply switch 410 and its gate as the second end coupled to the gates of the p-channel transistors in the output circuitry 430. In some examples, the coupling capacitor 402 is a metal-insulator-metal capacitor (MIMCAP), a metal-oxide-silicon capacitor (MOSCAP), or a metal-oxide-semiconductor field-effect transistor capacitor (MOSFET CAP).

The bandgap reference circuit 400 can further include an initialization circuitry having multiple transistors 404, 406, 408, 431, 433, e.g., n-channel transistors such as NMOS transistors, coupled to different components in the bandgap reference circuit 400. The initialization circuitry can be configured to initialize the components to the ground, such that the circuit 400 has no leakage current when the circuit 400 is not in use. Sources of the transistors can be coupled to the ground, gates of the transistors can be coupled to the gate of the power transistor 414 in the power supply switch 410 and configured to receive the ENB signal, and drains of the transistors can be coupled to the components. In such a way, the initialization circuitry enables to initialize the components to the ground when the ENB signal is high.

The drain of the transistor 404 is coupled to the second end of the coupling capacitor 402, the drain of the p-channel transistor 424 in the OPA 420, and the gates of the p-channel transistors 432, 434, 436 in the output circuitry 430. When the ENB signal is high, the transistor 404 is turned on to initialize the gate control voltage Vo to 0 V. The drain of the transistor 406 is coupled to the drain of the power transistor 414, and the transistor 406 can be configured to turn off the bandgap reference circuit 400 by pulling the controlled voltage Vpwr down to 0 V with the ENB signal being high. The drain of the transistor 408 is coupled to the drain of the p-channel transistor 422 and the gates of the p-channel transistors 422 and 424. The drain of the transistor 431 is coupled to the gate of the n-channel transistor 428 in the OPA 420 and the drain of the p-channel transistor 432 in the output circuitry 430, and the transistor 431 can be enabled to initialize the input voltage VA to be 0 V when the ENB signal is high. The drain of the transistor 433 is coupled to the gate of the n-channel transistor 426 in the OPA 420 and the drain of the p-channel transistor 434 in the output circuitry 430, and the transistor 433 can be enabled to initialize the input voltage VB to be 0 V when the ENB signal is high.

Referring to FIG. 5A, for the startup at the power-on stage, the supply voltage increases from 0 V and reaches VDD at time point ti. A POR signal is generated based on the supply voltage and increases from 0 V to a higher voltage (e.g., VDD) at ti and decreases to a lower voltage (e.g., 0 V) at time point tp0. The bandgap enabling (BGEN) signal is generated based on the POR signal. When the POR signal falls on an edge at tp0, the BGEN signal rises from 0 V to a higher voltage (e.g., VDD). Note that the bandgap reference circuit 400 does not receive the POR signal, but the BGEN signal. The ENB signal is generated by the inverter 412 based on the BGEN signal, and keeps high before tp0. Thus, before tp0, the initialization circuitry can enable the controlled supply voltage Vpwr, the gate control voltage Vo, and the bandgap reference (BGREF) voltage to be 0 V. That is, the bandgap reference circuit 400 can be turned off before tp0, which can avoid overshoots on other components, circuit, or devices. After tp0, the ENB signal goes low, and the controlled supply voltage Vpwr starts to increase, and the gate control voltage Vo correspondingly increases from 0 V to a higher voltage. The bandgap reference (BGREF) voltage also increases from 0 V and reaches a bandgap target voltage at tp1. A time period between tp0 and tp1 is the setup time Tsetup of the bandgap reference circuit 400. In some examples, at the end of power-on stage, VDD is about 3 V, Vo is about 2 V, and the bandgap target voltage is about 1 V. The setup time Tsetup can be about tens or hundreds of nanoseconds (ns), e.g., 100 ns to 200 ns, which can be more than one order of magnitude shorter than the setup time of the bandgap reference circuit 200.

Compared to the bandgap reference circuit 200 where the bandgap reference voltage has a high voltage VDD during the time period from ti to tp0, the bandgap reference voltage generated by the bandgap reference circuit 400 is initialized to 0 V before tp0. Moreover, the initialization circuitry of the circuit 200 cannot initialize the gate control voltage Vo to 0 V, because the supply voltage VDD is directly provided to the circuit 200, and the circuit 200 will be kept on and consume power if the gate control voltage Vo is 0 V. However, the bandgap reference circuit 400 can initialize the gate control voltage Vo to 0 V by the ENB signal, because the circuit 400 receives the controlled supply voltage Vpwr that can be initialized to 0 V by the same ENB signal and thus the circuit 400 is turned off. The bandgap reference voltage generated by the bandgap reference circuit 400 can increase from 0 V to the bandgap target voltage, compared to the bandgap reference voltage generated by the circuit 200 that decreases from a higher voltage such as the supply voltage VDD to the bandgap target voltage. Thus, the circuit 400 can have faster startup than the circuit 200 and can better avoid overshoots than the circuit 200.

Referring to FIG. 5B, during the normal operation stage, the supply voltage remains at VDD. The bandgap reference circuit 400 can be started up (or woken up) by receiving a bandgap enabling (BGEN) signal, e.g., a wake up signal such as a step signal, that increases from 0 V to a higher voltage (e.g., VDD) at tn0. Similar to the power-on stage illustrated in FIG. 5A, the ENB signal is generated by the inverter 412 based on the BGEN signal, and keeps high before tn0. Thus, before tn0, the initialization circuitry can enable the controlled supply voltage Vpwr, the gate control voltage Vo, and the bandgap reference (BGREF) voltage to be 0 V. That is, the bandgap reference circuit 400 can be turned off before tn0, which can avoid overshoots on other components, circuit, or devices. As the gate control voltage Vo is kept to be 0 V, there is no need for a pulse signal illustrated in FIG. 3B. After tn0, the ENB signal goes low, and the controlled supply voltage Vpwr starts to increase, and the gate control voltage Vo correspondingly increases from 0 V to a higher voltage. The bandgap reference (BGREF) voltage also increases from 0 V and reaches a bandgap target voltage at tn1. A time period between tn0 and tn1 is the setup time Tsetup of the bandgap reference circuit 400. The setup time Tsetup can be about one or few hundred nanosecond (ns), which can be more than one order of magnitude shorter than the setup time of the bandgap reference circuit 200.

Figure 6:
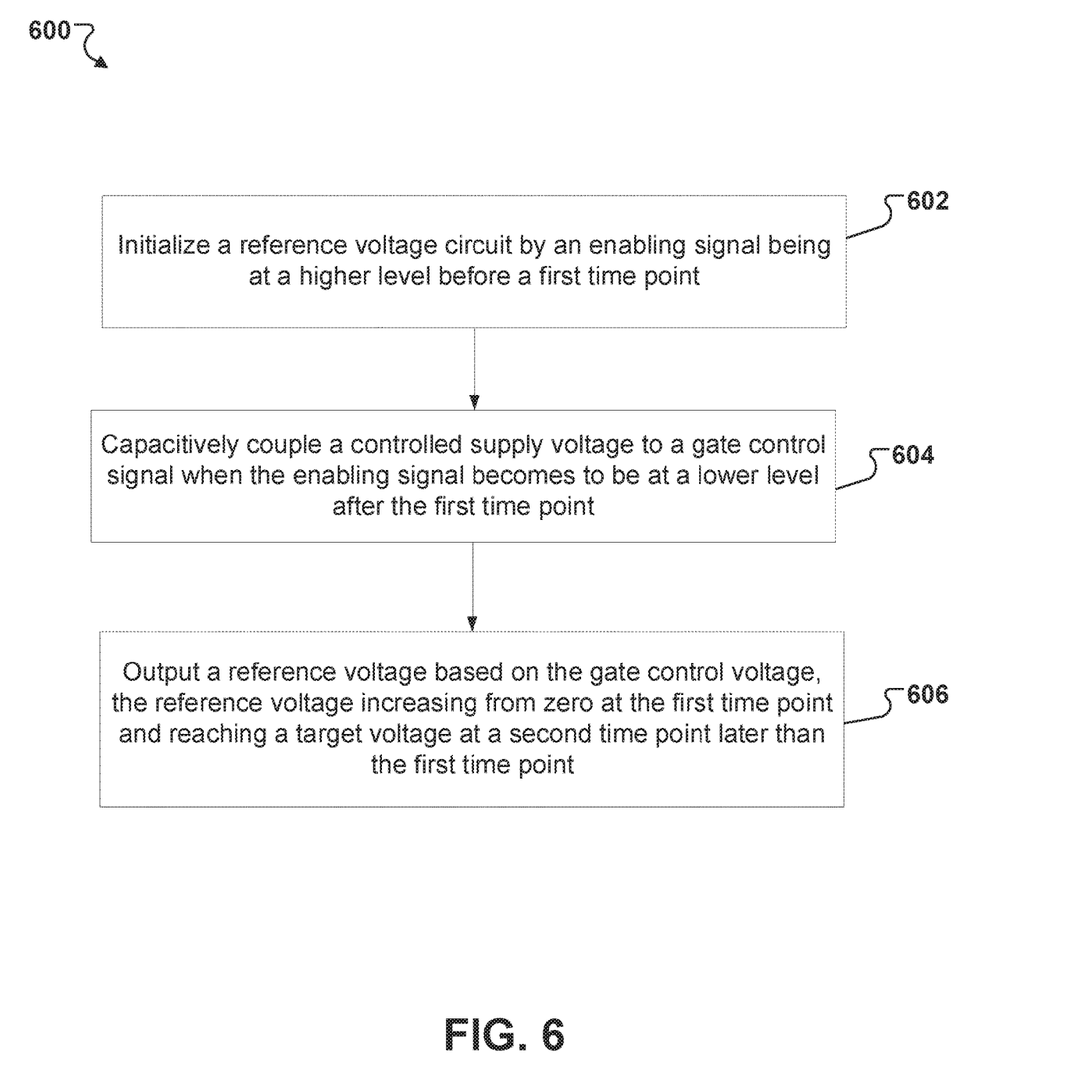
FIG. 6 illustrates a flow chart of an example of a process for managing startups of a reference voltage circuit, according to one or more implementations.

FIG. 6 illustrates a flow chart of an example of a process 600 for managing startups of a reference voltage circuit in a memory system, according to one or more implementations.

The memory system can be the device 110 of FIG. 1. The reference voltage circuit can be the reference voltage circuit 118 of FIG. 1, or the bandgap reference circuit 400 of FIG. 4. For example, the reference voltage circuit can be a bandgap reference circuit configured to provide a stable bandgap reference voltage to a memory controller, e.g., the device controller 112 of FIG. 1, that can use the bandgap reference voltage to perform an action on a memory cell in a memory, e.g., the memory 116 of FIG. 1. The process 600 can be performed by the reference voltage circuit.

The reference voltage circuit is initialized by an enabling signal before a first time point (602). The reference voltage circuit can include a power supply switch, an operational amplifier, and output circuitry. The power supply switch can be the power supply switch 410 of FIG. 4, and be configured to receive an original supply voltage and output a controlled supply voltage based on the enabling signal. The operational amplifier can be the OPA 420 of FIG. 4, and can be configured to receive input voltages from the output circuitry and the controlled supply voltage from the power supply switch and output a gate control voltage. The output circuitry can be the output circuitry 430 of FIG. 4, and can be configured to receive the gate control voltage from the operational amplifier and the controlled supply voltage from the power supply switch, provide the input voltages to the operational amplifier, and output a reference voltage. The reference voltage circuit can include initialization circuitry configured to perform the initialization. The initialization circuitry can be coupled to the power supply switch, the operational amplifier, and the output circuitry and configured to initialize the controlled supply voltage and the gate control voltage to ground based on the enabling signal before the first time point. The initialization circuitry can be configured to initialize the input voltages to be grounded based on the enabling signal, together with the controlled supply voltage and the gate control voltage.

In some implementations, the power supply switch includes a transistor having a gate for receiving the enabling signal and configured to generate the controlled supply voltage based on the original supply voltage based on the enabling signal. The transistor can be the power transistor 414 of FIG. 4. The power supply switch can further include an inverter coupled to the gate of the transistor and configured to convert a control signal into the enabling signal.

In some cases, during the startup in a power-on stage, the original supply voltage increases from zero to a target supply voltage, and the control signal is generated based on a power-on-reset (POR) signal that is obtained based on the original supply voltage. In some cases, during the startup in a normal operational stage, the original supply voltage remains at a target supply voltage, and the control signal is a wake up signal including a step signal.

In some implementations, the initialization circuitry includes a plurality of transistors having gates for receiving the enabling signal, sources coupled to a ground, and drains respectively coupled to the operational amplifier, the power supply switch, and the output circuitry.

In some implementations, the operational amplifier comprises p-channel transistors and n-channel transistors. Sources of the p-channel transistors can be coupled to the power supply switch and configured to receive the controlled supply voltage, gates of the p-channel transistors can be coupled to a drain of a first transistor of the initialization circuitry, and drains of the p-channel transistors can be coupled to drains of the n-channel transistors. Gates of the n-channel transistors can be configured to receive the input voltages from the output circuitry and respectively coupled to drains of second and third transistors of the initialization circuitry.

In some implementations, the output circuitry includes a plurality of p-channel transistors having gates coupled to the drain of one of the p-channel transistors of the operational amplifier and receive the gate control voltage, and the gates of the p-channel transistors of the output circuitry can be coupled to a drain of a fourth transistor of the initialization circuitry. The output circuitry can include a plurality of bipolar junction transistors (BJTs) having emitters respectively coupled to drains of the p-channel transistors of the output circuitry, and bases and collectors of the plurality of BJTs are coupled to the ground, and the reference voltage can be output at a connection node between a drain of one of the p-channel transistors of the output circuitry and an emitter of one of a corresponding BJT of the BJTs of the output circuitry.

The controlled supply voltage is capacitively coupled to the gate control signal when the enabling signal becomes to be at a lower level after the first time point (604). The reference voltage circuit can include a coupling capacitor having a first end coupled to the power supply switch for receiving the controlled supply voltage and a second end coupled to an output of the operational amplifier for outputting the gate control voltage. The coupling capacitor is configured such that the gate control voltage can vary synchronously with the controlled supply voltage during the startup and be substantially proportional to the controlled supply voltage. The second end of the coupling capacitor can be coupled to the drain of the fourth transistor of the initialization circuitry and the gates of the p-channel transistors of the output circuitry. In some examples, the coupling capacitor is an MOS transistor having source and drain coupled together as the first end and a gate as the second end.

The reference voltage is output based on the gate control voltage (606). The reference voltage increases from zero at the first time point and reaches a target voltage at a second time point later than the first time point. A time period between the first time point and the second time point is a setup (or startup) time of the reference voltage circuit. The setup time can be about tens to hundreds nanoseconds (e.g., 10 ns to 500 ns), which is more than one order of magnitude shorter than that of a reference voltage circuit having a startup time within in the microsecond range, e.g., the reference voltage circuit 200 of FIG. 2.

The reference voltage can be stabilized by the output circuitry to be independent from temperature, process corner, voltage, or a combination thereof. In a particular example, the output circuitry is configured such that the reference voltage is independent from PVT effect.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An integrated circuit comprising:
   a power supply switch configured to receive an original supply voltage and provide a controlled supply voltage controllable by an enabling signal;
   an operational amplifier configured to receive input voltages and the controlled supply voltage and output a gate control voltage;
   output circuitry configured to receive the gate control voltage from the operational amplifier and the controlled supply voltage from the power supply switch, provide the input voltages to the operational amplifier, and output a reference voltage; and
   initialization circuitry coupled to the power supply switch, the operational amplifier, and the output circuitry and configured to initialize the controlled supply voltage and the gate control voltage to a ground based on the enabling signal.

2. The integrated circuit of claim 1, wherein the initialization circuitry is configured such that the reference voltage increases from the ground to a target voltage during a startup of the integrated circuit.

3. The integrated circuit of claim 1, wherein the power supply switch comprises a transistor having a gate for receiving the enabling signal and configured to generate the controlled supply voltage based on the original supply voltage in response to the enabling signal.

4. The integrated circuit of claim 3, wherein the power supply switch comprises an inverter coupled to the gate of the transistor and configured to convert a control signal into the enabling signal.

5. The integrated circuit of claim 4, wherein, during a startup in a power-on stage, the control signal is based on a power-on-reset (POR) signal associated with the original supply voltage.

6. The integrated circuit of claim 4, wherein, during a startup in a normal operational stage, the original supply voltage remains at a target supply voltage, and the control signal comprises a step signal.

7. The integrated circuit of claim 1, wherein the initialization circuitry is configured to initialize the input voltages to be grounded based on the enabling signal, together with the controlled supply voltage and the gate control voltage.

8. The integrated circuit of claim 1, wherein the output circuitry is configured to stabilize the reference voltage to be independent from temperature, process corner, voltage, or a combination thereof.

9. The integrated circuit of claim 1, wherein the initialization circuitry comprises a plurality of transistors having gates for receiving the enabling signal, sources coupled to a ground, and drains respectively coupled to the operational amplifier, the power supply switch, and the output circuitry.

10. The integrated circuit of claim 9, wherein the operational amplifier comprises p-channel transistors and n-channel transistors,
wherein sources of the p-channel transistors are coupled to the power supply switch and configured to receive the controlled supply voltage, gates of the p-channel transistors are coupled to a drain of a first transistor of the initialization circuitry, and drains of the p-channel transistors are coupled to drains of the n-channel transistors, and
wherein gates of the n-channel transistors are configured to receive the input voltages from the output circuitry and respectively coupled to drains of second and third transistors of the initialization circuitry.

11. The integrated circuit of claim 10, wherein the output circuitry comprises:
a plurality of p-channel transistors having gates coupled to the drain of one of the p-channel transistors of the operational amplifier and receive the gate control voltage, wherein the gates of the p-channel transistors of the output circuitry are coupled to a drain of a fourth transistor of the initialization circuitry; and
a plurality of bipolar junction transistors (BJTs) having emitters respectively coupled to drains of the p-channel transistors of the output circuitry, and bases and collectors of the plurality of BJTs are coupled to the ground, wherein the reference voltage is output at a connection node between a drain of one of the p-channel transistors of the output circuitry and an emitter of one of a corresponding BJT of the BJTs of the output circuitry.

12. The integrated circuit of claim 11, further comprising:
a coupling capacitor having a first end coupled to the power supply switch for receiving the controlled supply voltage and a second end coupled to the drain of the fourth transistor of the initialization circuitry and the gates of the p-channel transistors of the output circuitry.

13. The integrated circuit of claim 1, further comprising a coupling capacitor having a first end coupled to the power supply switch for receiving the controlled supply voltage and a second end coupled to an output of the operational amplifier for outputting the gate control voltage,
wherein the coupling capacitor is configured such that the gate control voltage varies substantially proportionally and synchronously with the controlled supply voltage during the startup.

14. A memory system comprising:
a memory;
a memory controller coupled to the memory; and
a bandgap reference circuit coupled to the memory controller and configured to provide a bandgap reference voltage to the memory controller for performing one or more actions on the memory, the bandgap reference circuit comprising:
a power supply switch configured to receive an original supply voltage and provide a controlled supply voltage controllable by an enabling signal;
an operational amplifier configured to receive input voltages and the controlled supply voltage and output a gate control voltage;
output circuitry configured to receive the gate control voltage from the operational amplifier and the controlled supply voltage from the power supply switch, provide the input voltages to the operational amplifier, and output an output voltage as the bandgap reference voltage; and
initialization circuitry coupled to the power supply switch, the operational amplifier, and the output circuitry and configured to initialize the controlled supply voltage and the gate control voltage to a ground based on the enabling signal.

15. The memory system of claim 14, further comprising:
a coupling capacitor having a first end coupled to the power supply switch for receiving the controlled supply voltage and a second end coupled to an output of the operational amplifier for outputting the gate control voltage,
wherein the coupling capacitor is configured such that the gate control voltage varies substantially proportional and synchronously with the controlled supply voltage during a startup of the bandgap reference circuit.

16. The memory system of claim 14, wherein the initialization circuitry comprises a plurality of transistors having gates for receiving the enabling signal, sources coupled to a ground, and drains respectively coupled to the operational amplifier, the power supply switch, and the output circuitry.

17. The memory system of claim 16, wherein the operational amplifier comprises p-channel transistors and n-channel transistors,
wherein sources of the p-channel transistors are coupled to the power supply switch and configured to receive the controlled supply voltage, gates of the p-channel transistors are coupled to a drain of a first transistor of the initialization circuitry, and drains of the p-channel transistors are coupled to drains of the n-channel transistors, and
wherein gates of the n-channel transistors are configured to receive the input voltages from the output circuitry and respectively coupled to drains of second and third transistors of the initialization circuitry.

18. The memory system of claim 17, wherein the output circuitry comprises:
a plurality of p-channel transistors having gates coupled to the drain of one of the p-channel transistors of the operational amplifier and receive the gate control voltage, and wherein the gates of the p-channel transistors of the output circuitry are coupled to a drain of a fourth transistor of the initialization circuitry; and
a plurality of bipolar junction transistors (BJTs) having emitters respectively coupled to drains of the p-channel transistors of the output circuitry, and bases and collectors of the plurality of BJTs are coupled to the ground,
wherein the bandgap reference voltage is output at a connection node between a drain of one of the p-channel transistors of the output circuitry and an emitter of one of a corresponding BJT of the BJTs of the output circuitry.

19. The memory system of claim 14, wherein the power supply switch comprises:
a transistor having a gate for receiving the enabling signal, and
an inverter coupled to the gate of the transistor and configured to receive a control signal and convert the control signal into the enabling signal,
wherein the bandgap reference circuit is configured such that the bandgap reference voltage increases from the ground to a bandgap target voltage during a startup of the bandgap reference circuit, and
wherein the memory controller is configured to:
when the startup is in a power-on stage, generate a power-on-reset (POR) signal based on the original supply voltage, generate the control signal based on the POR signal, and provide the control signal to the inverter, and when the startup is in a normal operation range, generate a wakeup signal as the control signal and provide the output signal to the inverter.

20. An integrated circuit comprising:

a power supply switch configured to receive an enabling signal and an original supply voltage and to controllably output a controlled supply voltage at a power terminal with the controlled supply voltage at a first voltage when the enabling signal is in a first state and to have the power terminal grounded when the enabling signal is in a second state;

an operational amplifier including a pair of input terminals, a voltage supply terminal coupled to the power terminal to receive the controlled supply voltage, and an output terminal to output a gate control voltage;

output circuitry coupled to the output terminal of the operational amplifier to receive the gate control voltage and coupled to the power terminal to receive the controlled supply voltage, the output circuitry configured to generate and feedback a pair of input voltages to the pair of input terminals of the operational amplifier, and to output a reference voltage; and initialization circuitry coupled to the power supply switch, the operational amplifier, and the output circuitry, and configured to receive the enabling signal and to drive the controlled supply voltage and the gate control voltage to ground when the enabling signal is in the second state.

* * * * *